(12) United States Patent
Vlasko-Vlasov et al.

(10) Patent No.: US 6,972,562 B1
(45) Date of Patent: Dec. 6, 2005

(54) NEAR-FIELD MAGNETO-OPTICAL MICROSCOPE

(75) Inventors: Vitalii K. Vlasko-Vlasov, Downers Grove, IL (US); Ulrich Welp, Lisle, IL (US); George W. Crabtree, Chicago, IL (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 10/945,953

(22) Filed: Sep. 22, 2004

(51) Int. Cl.[7] .................. G01R 33/032; G01R 33/02
(52) U.S. Cl. .................. 324/244.1; 324/260; 324/753
(58) Field of Search ................... 324/244, 244.1, 324/252, 260–261, 750–753; 356/327, 445; 359/280, 368, 386, 484

(56) References Cited

U.S. PATENT DOCUMENTS 6,046,448 A * 4/2000 Sato et al. ............... 250/234

6,657,431 B2 * 12/2003 Xiao .......................... 324/244

* cited by examiner

Primary Examiner—Bot LeDynh
(74) Attorney, Agent, or Firm—Bradley W. Smith; Mark P. Dvorscak; Paul A. Gottlieb

(57) ABSTRACT

A device and method for mapping magnetic fields of a sample at a resolution less than the wavelength of light without altering the magnetic field of the sample is disclosed. A device having a tapered end portion with a magneto-optically active particle positioned at the distal end thereof in communication with a fiber optic for transferring incoming linearly polarized light from a source thereof to the particle and for transferring reflected light from the particle is provided. The fiber optic has a reflective material trapping light within the fiber optic and in communication with a light detector for determining the polarization of light reflected from the particle as a function of the strength and direction of the magnetic field of the sample. Linearly polarized light from the source thereof transferred to the particle positioned proximate the sample is affected by the magnetic field of the sample sensed by the particle such that the difference in polarization of light entering and leaving the particle is due to the magnetic field of the sample. Relative movement between the particle and sample enables mapping.

20 Claims, 1 Drawing Sheet

NEAR-FIELD MAGNETO-OPTICAL MICROSCOPE

CONTRACTUAL ORIGIN OF THE INVENTION

The United States Government has rights in this invention pursuant to Agreement between Argonne National Laboratory and pursuant to the employer-employee relationship of the U.S. Department of Energy and the inventors.

FIELD OF THE INVENTION

The present invention relates to devices for mapping the magnetic fields of magnetic materials with typical dimensions of less than about 250 nanometers (nm).

BACKGROUND OF THE INVENTION

Nano-science and nano-technology are emerging as major focal points in the study of physical and bio-physical phenomena as well as in the development of new classes of devices as described in "Nanotechnology leads U.S. thrust in R&D spending", G. Leopold, EE Times, Jun. 28, 1999. In particular, nano-structured magnetic materials with typical dimensions below 250 nm have been recognized as a very important class of materials since they form the basis for future technologies such as ultra-high density patterned magnetic storage media, non-volatile M-RAMs, and highly sensitive magnetic field sensors.

Transmission of light waves through nano-scale apertures enables near-field optical microscopy to achieve spatial resolution well beyond the diffraction limit set by the optical wavelength as described in D. W. Pohl et al., Appl. Phys. Letters 44, 651 (1984); E. Betzig et al., Science 262, 1422 (1994). In conventional near-field optical microscopy a tapered Al-coated optical fiber is scanned within a few nm over the sample surface while the sample is illuminated from a distant external light source. Light reflected from the surface is collected through an aperture on the very tip of the fiber where the Al-coating has been removed. Resolutions of 10 to 20 nm have been obtained this way, and this technique has emerged as a new method for nano-scale characterization of optical properties such as reflectance, fluorescence spectra, etc. as described in "Near Field Optics and Nanoscopy", J. P. Fillard, World Scientific, Singapore, 1996; "Near Field Optics" eds. D. W. Pohl, D. Courjon, Kluwer Academic Publication NATO ASI 242, 1993; D. Courjon, C. Bainier, Rep. Prog. Phys. 57, 989 (1994), M. Ohtsu (Ed.) "Near-Field Nano/Atom Optics and Technology", Springer (1998); R. Berg, Science 281, 629 (1998). In principle, the analysis of the polarization of the collected light in this configuration could be used for studying magnetic structures as described in F. Matthes et al., Ultramicroscopy 71, 243 (1998); G. Eggers et al., Ultramicroscopy 71, 249 (1998); P. Fumagalli et al., Appl. Phys. Letters 72, 2803 (1998). However, the signal carrying the magnetic information is superimposed on a large background, and therefore this configuration is not suitable as a practical approach. In addition, the interpretation of the images is difficult since they depend sensitively on the alignment of illumination, sample surface and aperture.

SUMMARY OF THE INVENTION

A crucial pre-requisite for advancing the understanding and development of these novel structures is the capability of characterizing and evaluating their magnetic properties on the nano-scale as a function of temperature and applied magnetic field. A tool is needed that allows for the quantitative, non-intrusive evaluation of the magnetization process in nano-structured materials with nm-spatial resolution. Presently, there is no satisfactory analytical technique available that fulfills these needs, but this invention Near-Field Magneto-optical Imaging (near-field MOI), satisfies these requirements.

Accordingly, an object of this invention is to provide a device having a tapered end portion with a magneto-optically active particle positioned at the distal end thereof for mapping magnetic fields of a sample at a resolution less than the wavelength of infrared light without altering the magnetic field of the sample, comprising a fiber optic for transferring incoming linearly polarized light from a source thereof to the particle and for transferring reflected light from the particle, the fiber optic having a reflective material trapping light within the fiber optic, and a light detector in communication with the fiber optic for determining the polarization of light reflected from the particle as a function of the strength and direction of the magnetic field of the sample, whereby linearly polarized light from the source thereof transferred to the particle positioned proximate the sample is affected by the magnetic field of the sample sensed by the particle such that the difference in polarization of light entering and leaving the particle is due to the magnetic field of the sample.

Another object of the invention is to provide a device for mapping magnetic fields of a sample without altering the magnetic field of the sample, comprising a magneto-optically active garnet particle positioned proximate the sample to be mapped, a fiber optic for transferring incoming linearly polarized light from a source thereof and for transferring reflected light from the garnet particle, a tapered substrate intermediate the garnet particle and the fiber optic providing optical communication therebetween and having the garnet particle at the tapered end thereof, the fiber optic and the substrate having a reflective material trapping light within the fiber optic and the substrate, mechanism providing relative movement in at least two axes between the garnet particle and the sample, and a light detector in communication with the fiber optic for determining the polarization of light reflected from the particle as a function of the strength and direction of the magnetic field of the sample, whereby linearly polarized light from the source thereof transferred to the particle is affected by the magnetic field of the sample sensed by the particle such that the difference in polarization of light entering and leaving the particle is due to the magnetic field of the sample.

A further object of the present invention is to provide a method for mapping magnetic fields of a sample at a resolution less than the wavelength of light without altering the magnetic field of the sample, comprising providing a device having a tapered end portion with a magneto-optically active particle positioned at the distal end thereof in communication with a fiber optic for transferring incoming linearly polarized light from a source thereof to the particle and for transferring reflected light from the particle, providing the fiber optic with a reflective material trapping light within the fiber optic, and providing a light detector in communication with the fiber optic for determining the polarization of light reflected from the particle as a function of the strength and direction of the magnetic field of the sample, whereby linearly polarized light from the source thereof transferred to the particle positioned proximate the sample is affected by the magnetic field of the sample sensed by the particle such that the difference in polarization of light entering and leaving the particle is due to the magnetic field of the sample.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF THE INVENTION

Figure 1:
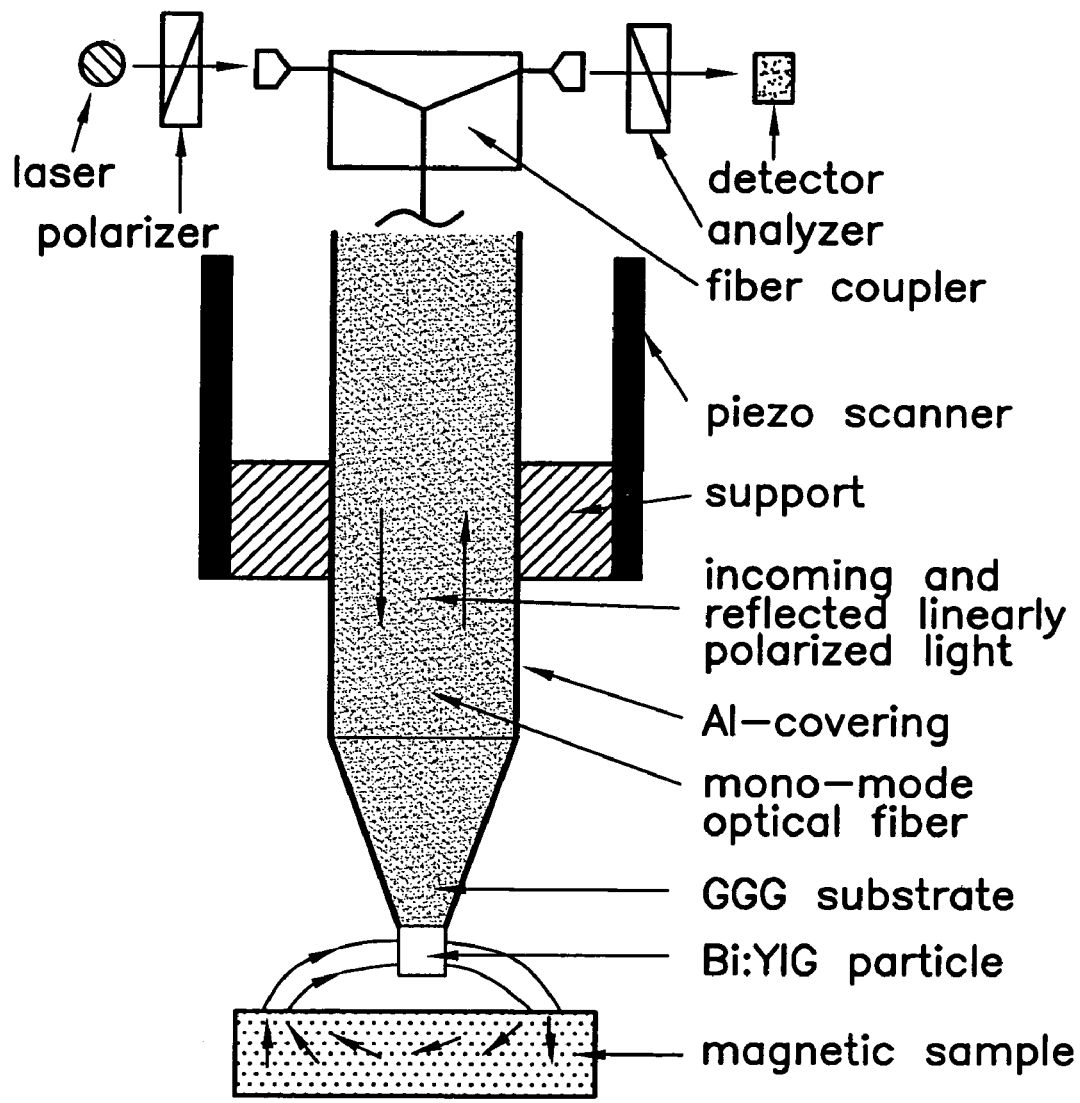
FIG. 1 is a schematic design of the multi-functional tip of the near-field magneto-optical microscope.

Referring to FIG. 1, the basic design of the near-field magneto-optical microscope is shown. The external optical components used for light generation, guidance and detection are shown schematically near the top of the figure. The magnetic fields generated by the sample are probed through the magneto-optical response of the special multi-functional tip. It consists of a gadolinium-gallium-garnet (GGG) substrate which carries a Bi or Ce doped rare-earth garnet particle. The interface between the GGG substrate and doped rare-earth garnet particle defines the optical aperture while the garnet particle provides very high magneto-optical activity including magnetic dichroism, and linear and circular magnetic birefringence. Incident linearly polarized light is transmitted first through the fiber, then through the GGG substrate defining the aperture and then scattered back by the garnet particle. The light travels back through the fiber and is analyzed with a polarization filter and photo detector. The magnetic information is contained in the polarization state of the reflected light, which depends on the strength and direction of the magnetic field at the garnet particle. Recent model calculations indicate that the magneto-optical activity persists even in particles with sizes much smaller then the optical wavelength. An image of the magnetic field distribution at the sample surface is generated by scanning the tip over the sample and recording the field information as function of position.

The invention offers three advantages over existing field mapping techniques. First, since the stray fields generated by the garnet particle are tiny there is no perturbation of the magnetic state of the sample. Second, by covering the entire tip assembly with an Al-layer it is achieved that the light is fully contained in the fiber/tip assembly never striking the sample. Therefore, the observed contrast is entirely magnetic in nature independent of geometrical and topographic effects. Third, the multi-functional tip combines transmission and reflection in a single rigid geometry, eliminating signal variations due to changing alignment of illumination, sample surface and aperture. Thus the system can be calibrated for quantitative field mapping by its response to known fields.

An important aspect of the operation of the microscope is the control of the distance of the tip to the sample surface. Shear force feedback for the distance control. sets the fiber tip into small-amplitude (1–10 nm) lateral oscillations through a piezo-electric drive. As the tip approaches the sample surface the amplitude and phase of these oscillations changes due to van der Waals interactions with the surface. A calibrated approach curve allows locking onto a preset distance value. A consequence of this mode of operation is that simultaneously with the magneto-optic image a topographic image with lateral resolution of about 5 nm and height resolution of better than 1 nm is acquired. The concurrent acquisition of topographic images with resolution similar to that of atomic force microscopy (AFM) greatly facilitates the interpretation of the magnetic images, for example when studying step-edge induced magnetic anisotropies.

Although the particle described herein is a Bi or rare earth doped garnet, other magneto-optical materials are available and useful, such as europium selenide or sulfide, both of which require low operating temperatures. Aluminum has been disclosed in the preferred embodiment, but any light reflective material is satisfactory. Preferably, the particle size is less than the wavelength of light, both visible and non-visible.

TABLE 1 shows a comparison of the existing techniques and near-field MOI.

| Tool | Advantages | Disadvantages |
| --- | --- | --- |
| MFM | established technology | stray fields of tip interfere with sample operation in applied fields problematic not quantitative |
| Scanning Hall Probe | no interference with sample operation in applied fields quantitative | limited spatial resolution (200 nm) |
| Lorentz Microscopy | very high spatial resolution: 2 nm quantitative | Very thin samples required Fields in electron microscope Elaborate |
| Near-field MOI | no interference with sample operation in applied fields high spatial resolution (<50 nm) quantitative | applied fields limited to about 2.5 kOe |

While the invention has been particularly shown and described with reference to a preferred embodiment hereof, it will be understood by those skilled in the art that several changes in form and detail may be made without departing from the spirit and scope of the invention.

The embodiments of the invention in which an exclusive property or privilege is claimed are defined as follows:

1. A device having a tapered end portion with a magneto-optically active particle positioned at the distal end thereof for mapping magnetic fields of a sample at a resolution less than the wavelength of light without altering the magnetic field of the sample, comprising a fiber optic for transferring incoming linearly polarized light from a source thereof to said particle and for transferring reflected light from said particle, said fiber optic having a reflective material trapping light within said fiber optic, and a light detector in communication with said fiber optic for determining the polarization of light reflected from said particle as a function of the strength and direction of the magnetic field of the sample, whereby linearly polarized light from the source thereof transferred to said particle positioned proximate the sample is affected by the magnetic field of the sample sensed by said particle such that the difference in polarization of light entering and leaving said particle is due to the magnetic field of the sample.

2. The device of claim 1, wherein said particle is less than about 1500 nanometers(nm).

3. The device of claim 1, wherein said particle is less than about the wavelength of visible light.

4. The device of claim 1, wherein said particle is less than about the wavelength of ultraviolet (UV).

5. The device of claim 1, wherein said reflective material is metallic.

6. The device of claim 1, wherein said reflective material is aluminum.

7. The device of claim 1, wherein said particle is a Bi or rare earth doped garnet.

8. The device of claim 1, wherein said particle is europium selenide or europium sulfide.

9. The device of claim 1, and further including mechanism providing relative movement between said particle and the sample to map a predetermined area of the sample.

10. The device of claim 9, wherein said mechanism provides relative movement between said particle and the sample in the x and y and z axes.

11. The device of claim 10, wherein said mechanism includes a piezo-electric drive providing lateral oscillations of said particle.

12. The device of claim 11, wherein the magnetic field is mapped with lateral resolution of about 5 nm and height resolution of less than about 1 nm.

13. A device for mapping magnetic fields of a sample without altering the magnetic field of the sample, comprising a magneto-optically active garnet particle positioned proximate the sample to be mapped, a fiber optic for transferring incoming linearly polarized light from a source thereof and for transferring reflected light from said garnet particle, a tapered substrate intermediate said garnet particle and said fiber optic providing optical communication therebetween and having said garnet particle at the tapered end thereof, said fiber optic and said substrate having a reflective material trapping light within said fiber optic and said substrate, mechanism providing relative movement in at least two axes between said garnet particle and the sample, and a light detector in communication with said fiber optic for determining the polarization of light reflected from said particle as a function of the strength and direction of the magnetic field of the sample, whereby linearly polarized light from the source thereof transferred to said particle is affected by the magnetic field of the sample sensed by said particle such that the difference in polarization of light entering and leaving said particle is due to the magnetic field of the sample.

14. The device of claim 13, wherein said particle in longest dimension is less than the wavelength of light.

15. The device of claim 13, wherein said reflective material is aluminum.

16. The device of claim 13, wherein said mechanism provides relative movement between said particle and the sample in the x and y and z axes.

17. The device of claim 16, wherein said mechanism includes a piezo-electric drive providing lateral oscillations of said particle.

18. The device of claim 17, wherein the magnetic field is mapped with lateral resolution of about 5 nm and height resolution of less than about 1 nm.

19. A method for mapping magnetic fields of a sample at a resolution less than the wavelength of light without altering the magnetic field of the sample, comprising providing a device having a tapered end portion with a magneto-optically active particle positioned at the distal end thereof in communication with a fiber optic for transferring incoming linearly polarized light from a source thereof to the particle and for transferring reflected light from the particle, providing the fiber optic with a reflective material trapping light within the fiber optic, and providing a light detector in communication with the fiber optic for determining the polarization of light reflected from the particle as a function of the strength and direction of the magnetic field of the sample, whereby linearly polarized light from the source thereof transferred to the particle positioned proximate the sample is affected by the magnetic field of the sample sensed by the particle such that the difference in polarization of light entering and leaving the particle is due to the magnetic field of the sample.

20. The method of claim 19, wherein the particle is Bi or Ce dope garnet.

* * * * *